US012750971B2

(12) United States Patent
Zeng et al.

(10) Patent No.: US 12,750,971 B2
(45) Date of Patent: Sep. 29, 2026

(54) POWER SUPPLY MECHANISM AND SERVER HAVING THE SAME

(71) Applicants: SQ TECHNOLOGY (SHANGHAI) CORPORATION, Shanghai (CN); INVENTEC CORPORATION, Taipei (TW)

(72) Inventors: Boheng Zeng, Shanghai (CN); Hong-Chou Lin, Taipei (TW); Yu-Fan Chen, Taipei (TW)

(73) Assignees: SQ TECHNOLOGY (SHANGHAI) CORPORATION, Shanghai (CN); INVENTEC CORPORATION, Taipei (TW)

( * ) Notice: Subject to any disclaimer, the term of this patent is extended or adjusted under 35 U.S.C. 154(b) by 79 days.

(21) Appl. No.: 18/974,871

(22) Filed: Dec. 10, 2024

(65) Prior Publication Data

US 2026/0052640 A1 Feb. 19, 2026

(30) Foreign Application Priority Data

Aug. 15, 2024 (CN) ......................... 202411128458.5

(51) Int. Cl.
*H05K 7/14* (2006.01)
*G06F 1/16* (2006.01)

(52) U.S. Cl.
CPC ......... *H05K 7/1492* (2013.01); *G06F 1/1656* (2013.01)

(58) Field of Classification Search
CPC ............................ H05K 7/1492; G06F 1/1656
USPC ....................................................... 361/679.2
See application file for complete search history.

(56) References Cited

U.S. PATENT DOCUMENTS

2011/0211317 A1* 9/2011 Lieberman ................ G06F 1/26 361/752
2014/0162483 A1* 6/2014 Chu .................... H04M 1/0274 439/271
2023/0127092 A1* 4/2023 Echizenya ........... H01R 13/516 439/271

* cited by examiner

*Primary Examiner* — Hung S. Bui

(57) ABSTRACT

A power supply mechanism for a server is provided. The server includes a computer case provided with an accommodating cavity and a power supply through hole that are in communication with each other. The power supply mechanism includes: a cable including a first wiring portion and a second wiring portion at both ends thereof; a waterproof housing provided in the accommodating cavity, wherein the waterproof housing is provided with a waterproof cavity, a first through hole, and a second through hole that are in communication with each other, the second wiring portion extends through the first through hole and is located in the waterproof cavity, and the second through hole is in communication with the power supply through hole; and a power supply plug extending through the power supply through hole and the second through hole and electrically connected to the second wiring portion.

8 Claims, 9 Drawing Sheets

POWER SUPPLY MECHANISM AND SERVER HAVING THE SAME

CROSS-REFERENCE TO RELATED APPLICATIONS

This application claims priority of Chinese Patent Application No. 2024111284585, filed on Aug. 15, 2024, entitled "POWER SUPPLY MECHANISM FOR SERVER AND SERVER", the entire content of which is incorporated herein by reference in its entirety.

TECHNICAL FIELD

The present disclosure relates to the technical field of immersion liquid cooling, and in particular to a power supply mechanism and a server having the same.

BACKGROUND

As the power consumption and heat generation of servers increase, immersion servers have emerged. A computer case of the immersion server contains a certain volume of coolant, which can dissipate the heat of elements in the server through the circulation of the coolant. A power supply mechanism of the server is configured to be connected an external power source to supply power to the electrical elements in the server. During the power supply process, a part of coolant will intrude into the power supply mechanism, causing damage to the power supply mechanism and affecting the normal use of the power supply mechanism. In the conventional technology, it is generally necessary to purchase a power supply mechanism having a better waterproof performance to prevent the power supply mechanism from being damaged due to the intrusion of the coolant. However, such a power supply mechanism is expensive, which leads to an increase in the manufacturing cost of the server.

SUMMARY

Accordingly, it is necessary to provide a power supply mechanism and a server having the same to address a problem that an overall manufacturing cost of a server increases due to the use of a power supply mechanism with better waterproof performance.

A power supply mechanism for a server is provided, the server includes a computer case, the computer case is provided with an accommodating cavity and a power supply through hole that are in communication with each other, the power supply mechanism includes:

- a cable including a first wiring portion and a second wiring portion at both ends thereof, and the first wiring portion is configured to be electrically connected to an electric element in the accommodating cavity;
- a waterproof housing provided in the accommodating cavity, wherein the waterproof housing is provided with a waterproof cavity, a first through hole, and a second through hole that are in communication with each other, the second wiring portion extends through the first through hole and is located in the waterproof cavity, and the second through hole is in communication with the power supply through hole; and
- a power supply plug extending through the power supply through hole and the second through hole and electrically connected to the second wiring portion.

According to the power supply mechanism for the server, the cable extends through the first through hole and is electrically connected to the power supply plug in the waterproof cavity, and the power supply plug extends through the second through hole and the power supply through hole and extends out of the computer case to be connected to an external power source, so that the electric energy of the external power source is transmitted to the cable through the second wiring portion and then transmitted to the electric element through the first wiring portion. The second wiring portion is located in the waterproof cavity. The waterproof housing can prevent the coolant in the accommodating cavity from entering the waterproof cavity, so as to prevent the coolant from entering a conjunction between the second wiring portion and the power supply plug and affecting the power supply effect of the power supply mechanism. There is no need to purchase a power supply mechanism with better waterproof performance, thereby reducing the overall manufacturing cost of the server.

In one of the embodiments, the waterproof housing includes a housing cover and a housing body, the housing cover is connected to the housing body to form the waterproof cavity, the first through hole is provided on the housing cover, and the second through hole is provided on the housing body.

In one of the embodiments, a side of the waterproof housing away from the accommodating cavity is provided with a flange, and the flange is configured to abut against a hole wall of the power supply through hole.

In one of the embodiments, the flange extends circumferentially around the second through hole to form a moving channel, the power supply plug comprises a moving portion electrically connected to the second wiring portion, and the moving portion extends through the moving channel and is capable of moving in a radial direction of the moving channel.

In one of the embodiments, the power supply plug further includes a power clip and a base plate, one side of the base plate is connected to the power clip, another side of the base plate is connected to the moving portion, and the base plate is located outside the computer case and is configured to abut against an outer wall of the computer case.

In one of the embodiments, the power supply mechanism for the server further includes a limiting cover provided outside the computer case, the limiting cover is provided with a limiting groove arranged toward the power supply through hole, a bottom wall of the limiting groove is provided with a moving through hole and is capable of abutting against the base plate, and the power clip extends through the moving through hole and is capable of move in a radial direction of the moving through hole.

In one of the embodiments, the base plate is provided with a limiting protrusion on a side thereof away from the computer case, the bottom wall of the limiting groove is further provided with a strip-shaped through hole, and the limiting protrusion extends through the strip-shaped through hole.

In one of the embodiments, the base plate is provided with an elastic protrusion on the side thereof away from the computer case, and the elastic protrusion is capable of abutting against the bottom wall of the limiting groove.

In one of the embodiments, the power supply mechanism for the server further includes a sealing member provided in the first through hole and configured to allow the cable to extend through.

In one of the embodiments, the sealing member includes a cable gland provided in the waterproof housing, and the cable gland is provided with a mounting through hole in communication with the first through hole.

A server is further provided, including a computer case provided with an accommodating cavity and a power supply through hole that are in communication with each other; an electrical element provided in the accommodating cavity and the foregoing power supply mechanism.

The details of one or more embodiments of the application are set forth in the accompanying drawings and the description below. Other features, objects, and advantages of the application will be apparent from the description and drawings, and from the claims.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DESCRIPTION OF REFERENCE NUMERALS

Figure 1:
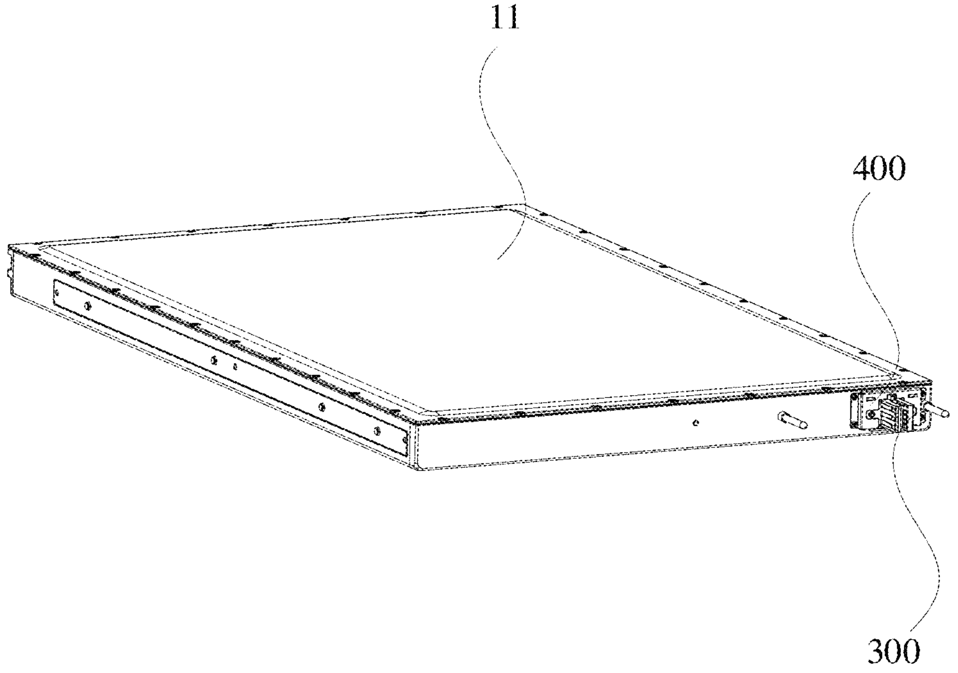
FIG. 1 is a perspective view of a server according to an embodiment.

11. Computer case; 12. accommodating cavity; 13. Power supply through hole; 100. Cable; 110. First wiring portion; 120. Second wiring portion; 200. Waterproof housing; 210. First through hole; 220. Second through hole; 230. Waterproof cavity; 240. Flange; 241. Second welding line; 250. Moving channel; 261. Housing body; 262. Housing cover; 270. First welding line; 300. Power supply plug; 310. moving portion; 320. Power clip; 330. Base plate; 331. Limiting protrusion; 332. Elastic protrusion; 400. Limiting cover; 410. Limiting groove; 411. Moving through hole; 412. Strip-shaped through hole; 420. Bolt; 500. Sealing member; 510. Cable gland; 511. Mounting through hole; 512. Sealing base; 513. Sealing ring; 514. Fastening knob.

DETAILED DESCRIPTION OF THE EMBODIMENTS

In order to make the above objectives, features and advantages of the present disclosure clear and easier to understand, the specific embodiments of the present disclosure are described in detail below in combination with the accompanying drawings. Many specific details are set forth in the following description to facilitate a full understanding of the present disclosure. However, the present disclosure can be implemented in many ways different from those described herein, and those skilled in the art can make similar improvements without departing from the connotation of the present disclosure. Therefore, the present disclosure is not limited by the specific embodiments disclosed below.

In the description of the present disclosure, it should be understood that the terms "center", "longitudinal", "transverse", "length", "width", "thickness", "upper", "lower", "front", "rear", "left", "right", "vertical", "horizontal", "top", "bottom", "inner", "outer", "clockwise", "counter-clockwise", "axial", "radial", "circumferential direction" are based on the azimuths or position relationships shown in the attached drawings. These terms are only for the convenience of describing the present disclosure and simplifying the description, rather than indicating or implying that the indicated devices or elements must have the specific azimuths, or be constructed or operated in the specific azimuths, and therefore such terms cannot be understood as limitations of the present disclosure.

In addition, the terms "first" and "second" are only used for descriptive purposes and cannot be understood as indicating or implying relative importance or implicitly indicating the number of indicated technical features. Thus, the features defined with "first" and "second" may explicitly or implicitly include at least one of the features. In the description of the present disclosure, "a plurality of" means at least two, such as two, three, etc., unless otherwise expressly and specifically defined.

In the present disclosure, unless otherwise expressly specified and limited, the terms "mount", "connect", "couple", "fix" and the like should be interpreted broadly. For example, the terms can mean fixed connection, detachable connection, or being integrated. The terms can mean mechanical connection or electrical connection. The terms can mean directly connection or indirectly connection through an intermediate medium. The terms can mean connection within two elements or interaction relationship between two elements, unless otherwise expressly limited. For those skilled in the art, the specific meaning of the above terms in the present disclosure should be understood according to the specific situation.

In the present disclosure, unless otherwise expressly specified and limited, a first feature "above" or "below" a second feature may be in direct contact with the second feature, or the first and second features may be in indirect contact through an intermediate medium. Moreover, the first feature "above" the second feature may be right above or obliquely above the second feature, or the first feature may be merely located at a height higher than the second feature. The first feature "below" the second feature may be right below or obliquely below the second feature, or the first feature may be merely located at a height lower than that of the second feature.

It should be noted that when an element is called "fixed to" or "mounted on" another element, it can be directly on another element or there can be an intermediate element. When an element is considered to be "connected" to another element, it can be directly connected to another element or there can be an intermediate element. The terms "vertical", "horizontal", "up", "down", "left", "right" and similar expressions used herein are for the purpose of illustration only and do not represent the only ways for implementation.

Figure 2:
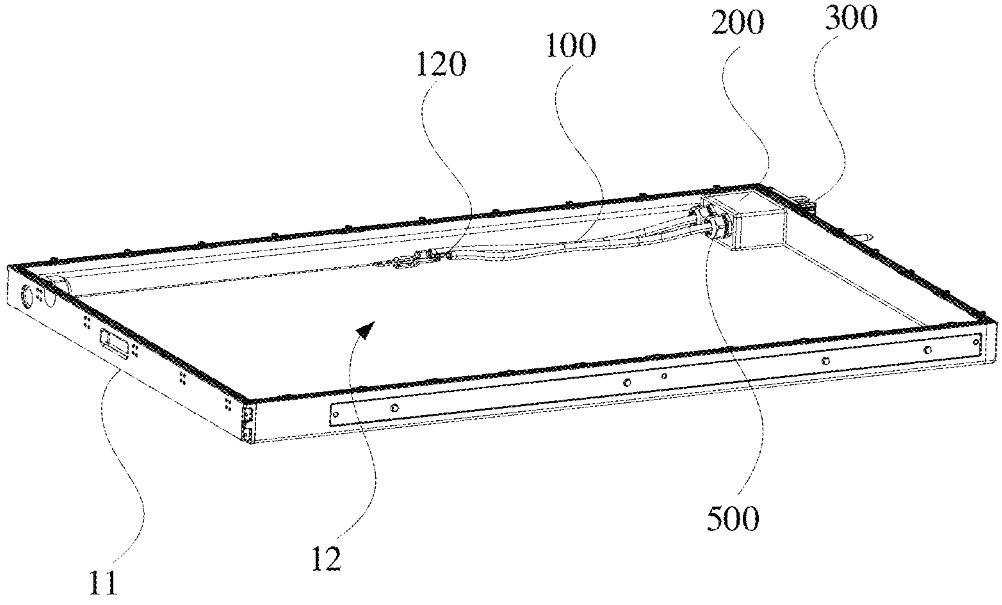
FIG. 2 is a perspective view of the server of FIG. 1 showing an accommodating cavity.

Referring to FIG. 1 and FIG. 2, in one embodiment, a server is provided, which includes a computer case 11, an electrical element, and a power supply mechanism. The computer case 11 is provided with an accommodating cavity 12 and a power supply through hole 13 that are in communication with each other. The electric element and a coolant are provided in the accommodating cavity 12. The coolant can exchange heat with the electric element to ensure the heat exchange effect of the electric element.

Referring to FIG. 2 to FIG. 5, the power supply mechanism for the server is provided according to an embodiment of the present disclosure, which includes a cable 100, a waterproof housing 200, and a power supply plug 300. Opposite ends of the cable 100 are respectively provided with a first wiring portion 110 and a second wiring portion 120. The first wiring portion 110 is configured to be electrically connected to the electrical element in the accommodating cavity 12. The waterproof housing 200 is provided in the accommodating cavity 12. The waterproof housing 200 is provided with a waterproof cavity 230, a first through hole 210, and a second through hole 220 that are in communication with each other. The second wiring portion 120 extends through the first through hole 210 and is located in the waterproof cavity 230. The second through hole 220 is in communication with the power supply through hole 13. The power supply plug 300 extends through the power supply through hole 13 and the second through hole 220, and is electrically connected to the second wiring portion 120.

According to the aforementioned power supply mechanism, the cable 100 extends through the first through hole 210 and is electrically connected to the power supply plug 300 in the waterproof cavity 230, and the power supply plug 300 extends through the second through hole 220 and the power supply through hole 13 and extends out of the computer case 11 to be connected to an external power source, so that the electric energy of the external power source is transmitted to the cable 100 through the second wiring portion 120 and then transmitted to the electric element through the first wiring portion 110. The second wiring portion 120 is located in the waterproof cavity 230. The waterproof housing 200 can prevent the coolant in the accommodating cavity 12 from entering the waterproof cavity 230, so as to prevent the coolant from entering a conjunction between the second wiring portion 120 and the power supply plug 300 and affecting the power supply effect of the power supply mechanism. There is no need to purchase a power supply mechanism with better waterproof performance, thereby reducing the overall manufacturing cost of the server.

Figure 3:
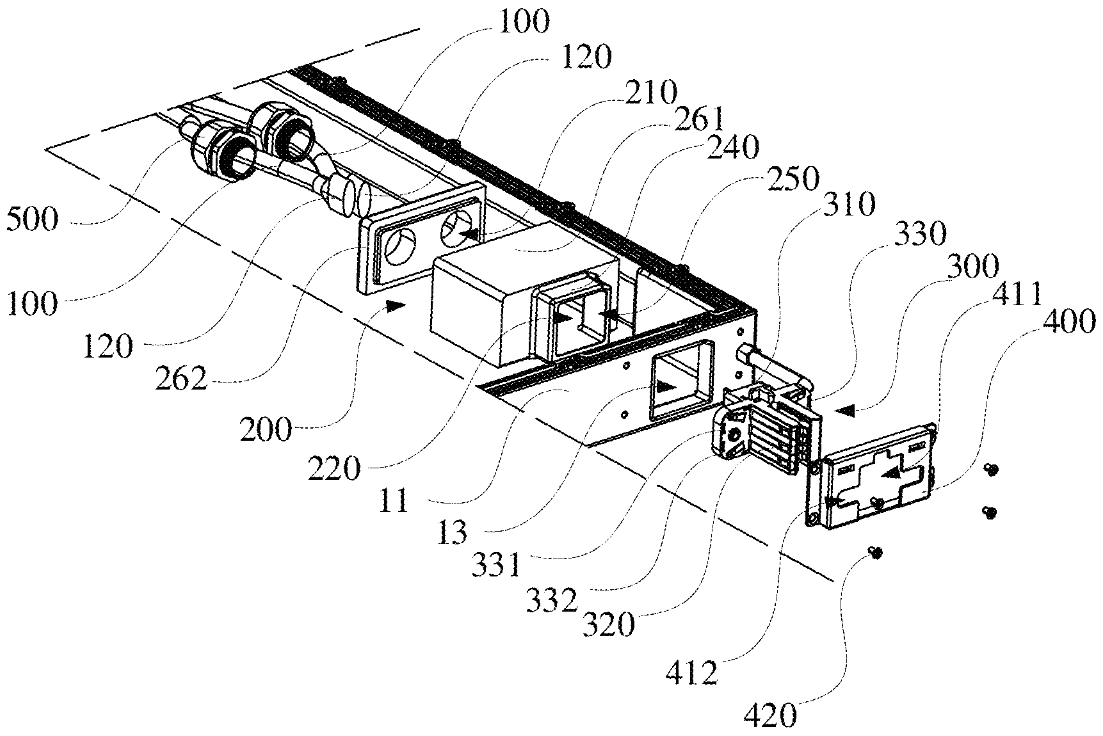
FIG. 3 is an enlarged, exploded view of a power supply mechanism according to an embodiment.

Further, referring to FIG. 3, a cross-sectional shape of the second through hole 220 and a cross-sectional shape of the cable 100 are both circular, and a diameter of the second through hole 220 is the same as a diameter of the cross-sectional shape of the cable 100, so as to prevent the coolant from flowing into the waterproof cavity 230 from a space between the cable 100 and a hole wall of the second through hole 220.

Further, in the embodiment, the waterproof housing 200 can not only prevent the coolant from entering the waterproof cavity 230 and affecting the connection effect of the connection between the second wiring portion 120 and the power supply plug 300, but also can prevent the coolant in the accommodating cavity 12 of the computer case 11 from flowing out from the power supply through hole 13 of the computer case 11, thereby improving the overall anti-leakage effect of the computer case 11.

Figure 4:
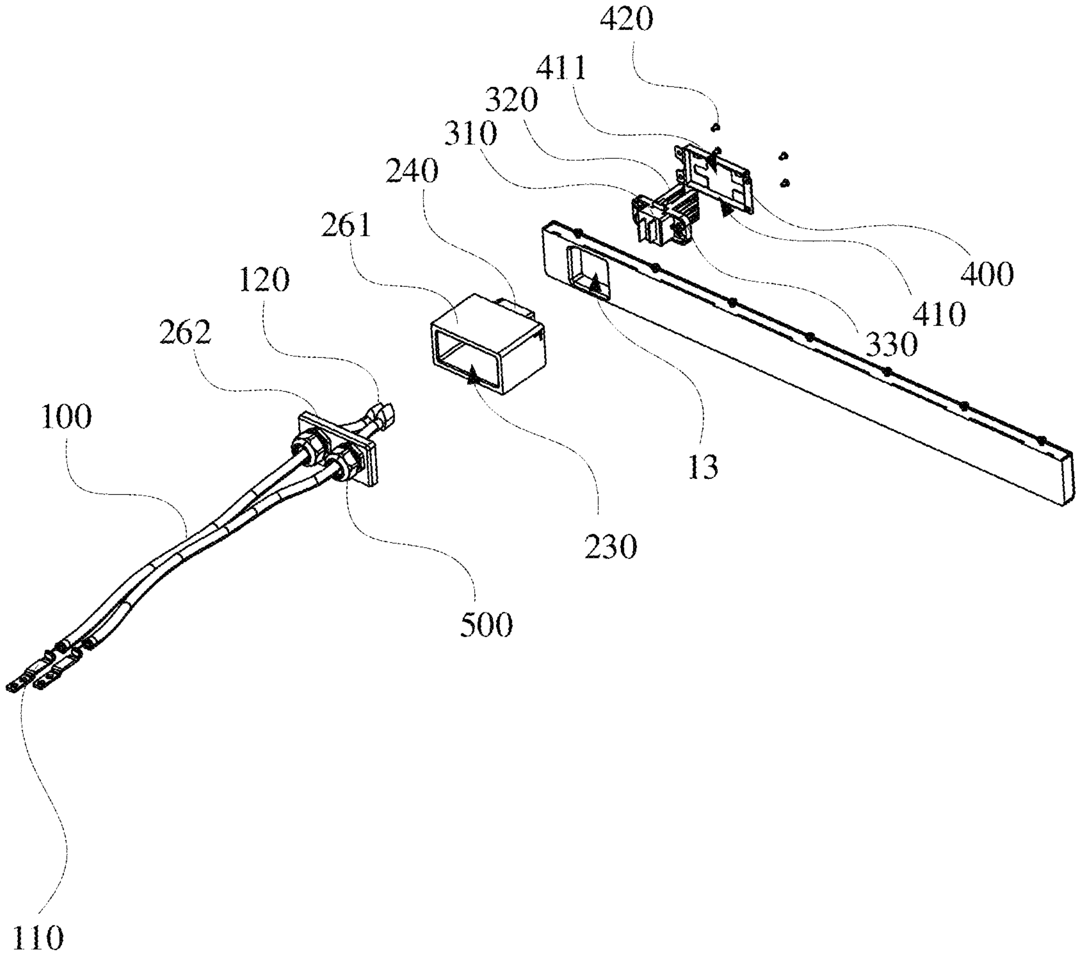
FIG. 4 is an exploded view of the power supply mechanism viewed from another aspect according to an embodiment.

Referring to FIG. 2 to FIG. 4, in an embodiment, the waterproof housing 200 is a cuboid and is located at a corner of the accommodating cavity 12. A vertex where the three side surfaces of the waterproof housing 200 intersect corresponds to a vertex where two side walls and a bottom wall of the accommodating cavity 200 intersect, so that the three side surfaces of the waterproof housing 200 are respectively attached to the two side walls and the bottom wall of the accommodating cavity 200, such that not only the space of the accommodating cavity 12 can be saved, but also the power supply through hole 13 can be effectively sealed, and the coolant in the accommodating cavity 12 is further ensured not to flow out from the power supply through hole 13.

Figure 8:
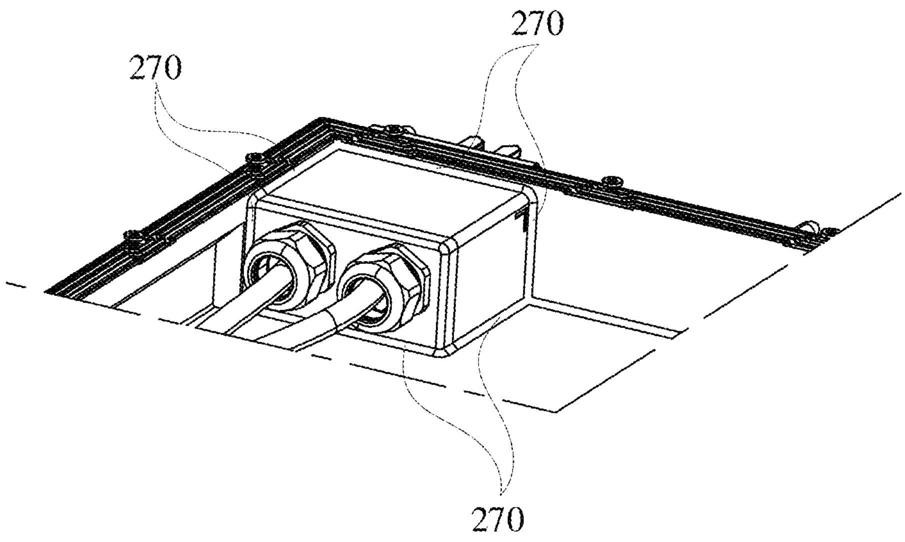
FIG. 8 is an enlarged view of a first welding line according to an embodiment.

Further, referring to FIG. 8, the cuboid waterproof housing 200 is connected to the two side walls and the bottom wall of the accommodating cavity 12 by welding, and a first welding line 270 formed by welding can further enhance the waterproof housing effect, and the cost is low and the anti-leakage effect is reliable.

Referring to FIG. 3 and FIG. 4, in an embodiment, two cables 100 are provided, which are a positive cable 100 and a negative cable 100, respectively. Two first through holes 210 are provided and are arranged in one-to-one correspondence with the two cables 100, and details are not described herein again.

Referring to FIG. 3 and FIG. 4, in an embodiment, the waterproof housing 200 includes a housing cover 262 and a housing body 261. The housing cover 262 is connected to the housing body 261 to form the waterproof cavity 230. The first through hole 210 is provided on the housing cover 262, and the second through hole 220 is provided on the housing body 261.

In this way, the cable 100 can firstly extend through the first through hole 210 of the housing cover 262 before the housing cover 262 and the housing body 261 are assembled, so that the second wiring portion 120 is mounted in the waterproof cavity 230, and the mounting process is simple.

Specifically, the housing cover 262 and the housing body 261 are connected by welding, such connection process is simple and the implementation cost is low. The welding line is formed at the connection between the housing cover 262 and the housing body 261, and the anti-leakage effect is reliable.

Referring to FIG. 3 and FIG. 4, in an embodiment, a side of the waterproof housing 200 away from the accommodating cavity 1 is provided with a flange 240, and the flange 240 is configured to abut against a hole wall of the power supply through hole 13. Therefore, not only the connection strength between the waterproof housing 200 and the accommodating cavity 12 can be enhanced, but also the coolant in the accommodating cavity 12 can be prevented from flowing out from the power supply through hole 13, thereby improving the anti-leakage effect of the computer case 11.

Referring to FIG. 3, FIG. 4, FIG. 6 and FIG. 7, in an embodiment, the flange 240 extends circumferentially around the second through hole 220 to form a moving channel 250. The power supply plug 300 includes a moving portion 310, and the moving portion 310 is electrically connected to the second wiring portion 120. The moving portion 310 extends through the moving channel 250 and is capable of moving in a radial direction of the moving channel 250.

The moving portion 310 can move along the radial direction of the moving channel 250, so that the moving portion 310 drives the whole power supply plug 300 to move relative to the computer case 11. When the power supply plug 300 needs to be connected to the power source, a plugging error between the power supply plug 300 and the power source can be eliminated. The power supply plug 300 is prevented from being damaged due to an error in position when the power supply plug 300 is connected to the power source, and the assembly applicability is ensured.

Specifically, the power supply plug 300 is configured to be electrically connected to a busbar through plugging. During the plugging process, a position of the power supply plug 300 needs to be aligned with a position of the busbar. However, due to an error in the production process or an error in manual assembly, the positions of the power supply plug 300 and the busbar cannot completely correspond to each other. Since the moving portion 310 can move in the radial direction of the moving channel 250, the plugging error between the power supply plug 300 and the busbar can be effectively eliminated, and the assembly applicability and the assembly reliability can be ensured.

Further, referring to FIG. 3, the flange 240 extends circumferentially around the second through hole 220 to form the protruding moving channel 250 on the side of the second through hole 220 away from the accommodating cavity 12. A cross-sectional area of the moving channel 250 is greater than a cross-sectional area of the moving portion 310, so that the moving portion 310 can move along the radial direction of the moving channel 250. In addition, the flange 240 can abut against and cooperate with the hole wall of the power supply through hole 13, so as to prevent the coolant in the accommodating cavity 12 from flowing out from the power supply through hole 13, thereby further improving the anti-leakage effect of the computer case 11.

Figure 9:
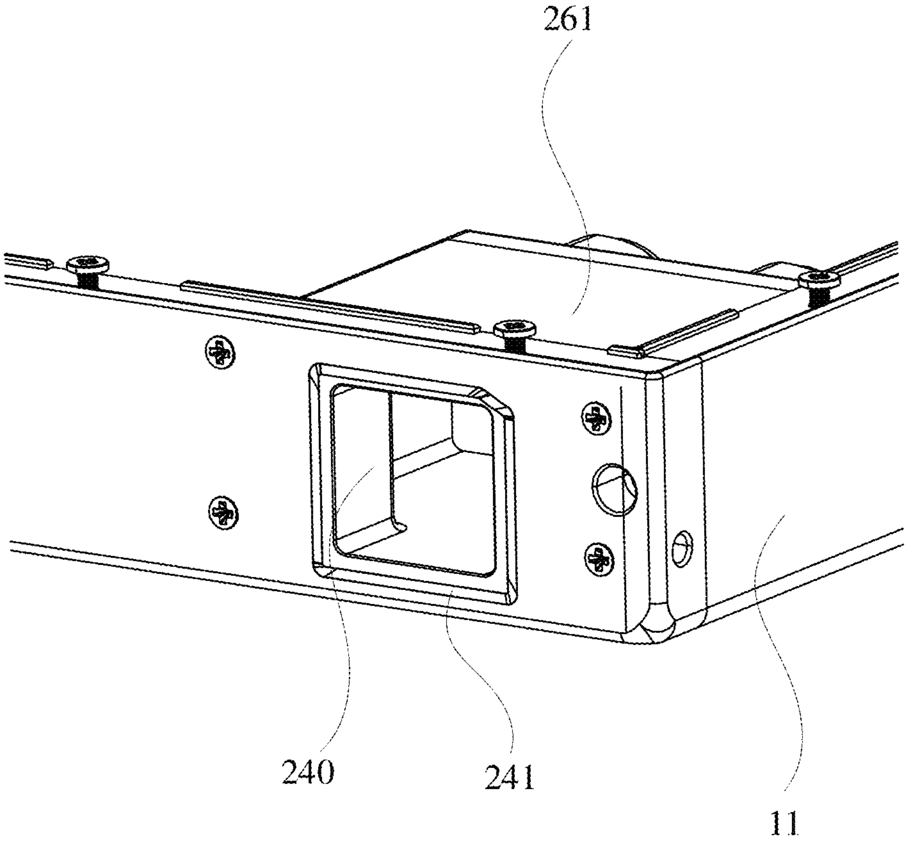
FIG. 9 is an enlarged view of a second welding line according to an embodiment.

Referring to FIG. 9, in an embodiment, the flange 240 is connected to the hole wall of the power supply through hole 13 by welding, and a second welding line 241 is formed along a circumferential direction of the hole wall of the power supply through hole 13, so that the anti-leakage effect is reliable and the cost is low.

Referring to FIG. 3, in an embodiment, the power supply plug 300 further includes a power clip 320 and a base plate 330. One side of the base plate 330 is connected to the power clip 320, and the other side of the base plate 330 is connected to the moving portion 310. The base plate 330 is located outside the computer case 11 and is configured to abut against an outer wall of the computer case 11.

The power clip 320 is provided on one side of the base plate 330 and is configured to be plugged into the busbar, and the other side of the base plate 330 is connected to the moving portion 310 and is configured to abut against the outer wall of the computer case 11, so as to limit the power supply plug 300 to move into the waterproof cavity 230 along the axial direction of the moving channel 250, and ensure that the power clip 320 can be effectively plugged into the busbar.

Specifically, an area of the base plate 330 is greater than the cross-sectional area of the moving channel 250, so as to prevent the base plate 330 located outside the computer case 11 from entering the waterproof cavity 230 from the moving channel 250.

Referring to FIG. 3, FIG. 4, FIG. 6 and FIG. 7, in an embodiment, the power supply mechanism for the server further includes a limiting cover 400 provided outside the computer case 11. The limiting cover 400 is provided with a limiting groove 410 arranged toward the power supply through hole 13. A bottom wall of the limiting groove 410 is provided with a moving through hole 411 and is capable of abutting against the base plate 330. The power clip 320 extends through the moving through hole 411 and is capable of moving in a radial direction of the moving through hole 411.

The limiting cover 400 is provided outside the computer case 11 and has a limiting groove 410, and the limiting groove 410 is arranged toward the power supply through hole 13. The bottom wall of the limiting groove 410 abuts against a side of the base plate 330 away from the power supply through hole 13, so as to limit the base plate 330 from moving along the radial direction of the moving channel 250, thereby preventing the moving portion 310 from moving in a direction away from the waterproof cavity 230. The moving through hole 411 formed in the bottom wall of the limiting groove 410 is configured to allow the power clip 320 to extend through, so that the power clip 320 can be plugged into the busbar to supply power. The power clip 320 can move along the radial direction of the moving through hole 411, which can eliminate the plugging error between the power clip 320 and the busbar, so as to prevent the power clip 320 from being damaged due to the error in position when the power clip 320 is connected to the busbar, and ensure assembly applicability.

Specifically, a cross-sectional area of the moving through hole 411 is greater than a cross-sectional area of the power clip 320, so as to reserve enough moving space for the power clip 320 to eliminate the plugging error between the power clip 320 and the busbar.

Referring to FIG. 3, FIG. 4, FIG. 6 and FIG. 7, in an embodiment, the limiting cover 400 is detachably mounted to the outer wall of the computer case 11 through bolts 420, such that the mounting cost is low and the mounting effect is reliable.

Referring to FIG. 3, FIG. 4, FIG. 6 and FIG. 7, in an embodiment, the base plate 330 is provided with a limiting protrusion 331 on a side thereof away from the computer case 11. The bottom wall of the limiting groove 410 is further provided with a strip-shaped through hole 412, and the limiting protrusion 331 extends through the strip-shaped through hole 412. The limiting protrusion 331 on the side of the base plate 330 away from the computer case 11 can extend through the strip-shaped through hole 412 of the limiting cover 400, and the limiting protrusion 331 can move along an extension direction of the strip-shaped through hole 412, so as to drive the base plate 330 and the power clip 320 to move along the extension direction of the strip-shaped through hole 412, and prevent the power clip 320 from being misaligned with the busbar due to improper movement position.

Optionally, the extension direction of the strip-shaped through hole 412 may be a straight line or a curve. The strip-shaped through hole 412 can be in communication with the moving through hole 411 or not, which can be flexibly arranged according to the actual assembly situation, and is not specifically limited herein. Specifically, referring to FIG. 6 and FIG. 7, the strip-shaped through hole 412 extends in a straight line and is in communication with the moving through hole 411.

Further, a width of the strip-shaped through hole 412 is slightly greater than a diameter of an across-section of the limiting protrusion 331, so that the limiting protrusion 331 can have a certain displacement margin in a direction perpendicular to the extension direction of the strip-shaped through hole 412, and the displacement flexibility of the power clip 320 is further improved while preventing the power clip 320 from being misaligned with the busbar due to improper movement position.

Figure 6:
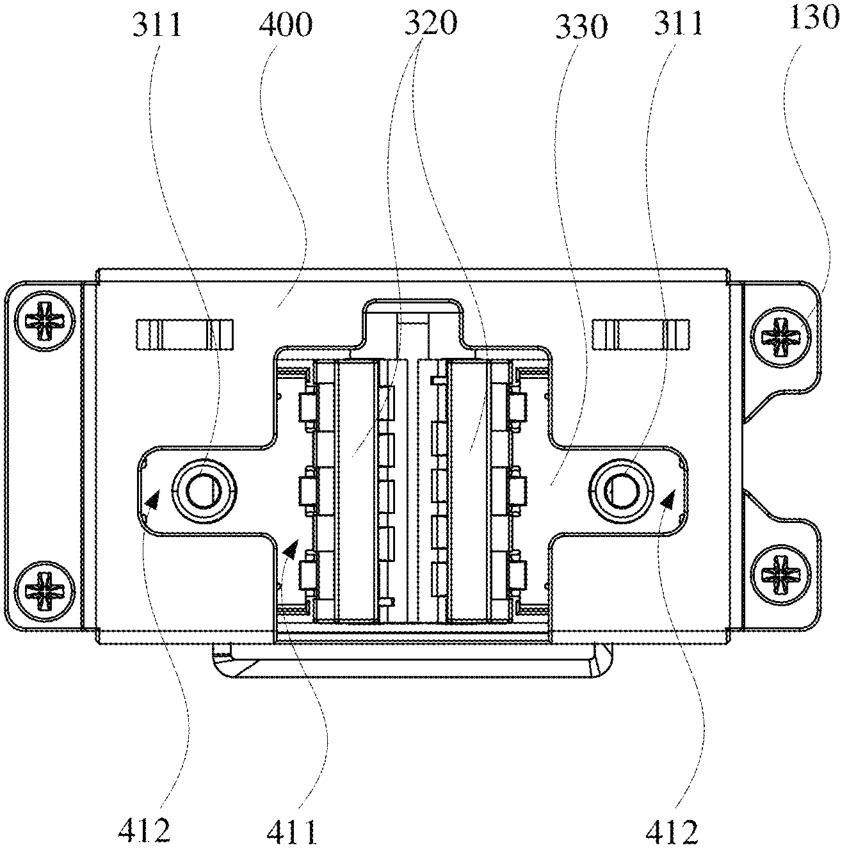
FIG. 6 is a side view of a power supply plug assembled to a limiting cover according to an embodiment.
Figure 7:
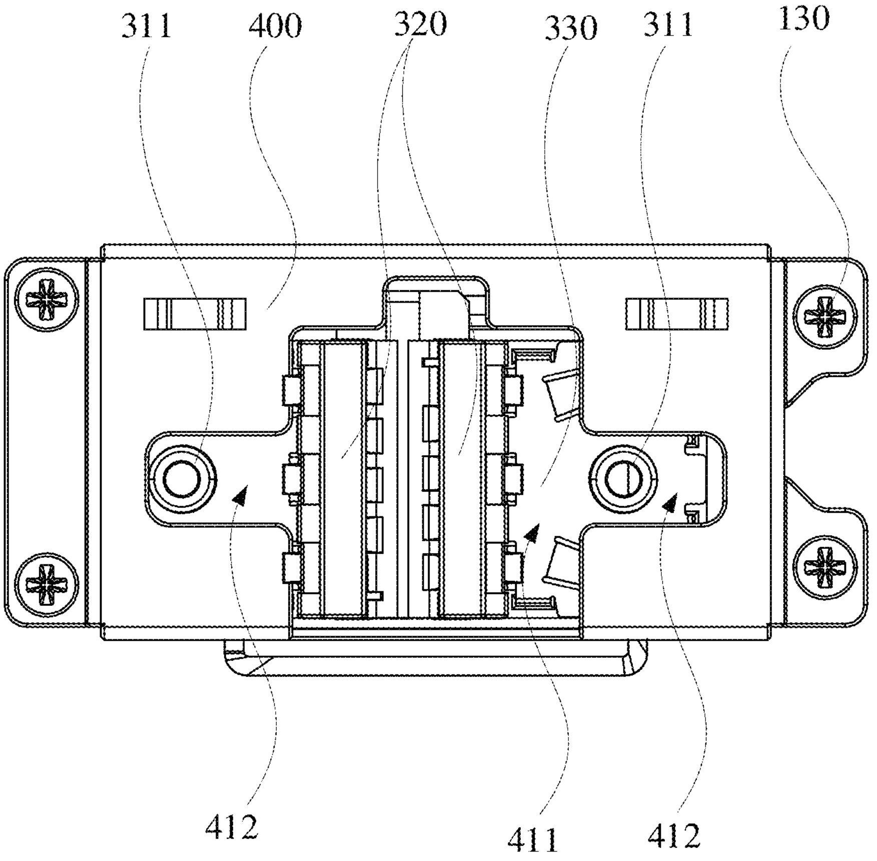
FIG. 7 is a side view of the power supply plug moved in a moving through hole of the limiting cover according to an embodiment.

Referring to FIG. 6 and FIG. 7, in an embodiment, at least two strip-shaped through holes 412 are provided. The extension directions of the strip-shaped through holes 412 are parallel. At least two limiting protrusions 331 are provided and arranged in one-to-one correspondence with the strip-shaped through holes 412. Such an arrangement can improve reliability and stability of the base plate 330 and the power clip 320 when moving along the extension direction of the strip-shaped through holes 412.

Referring to FIG. 3, in an embodiment, the base plate 330 is provided with an elastic protrusion 332 on the side thereof away from the computer case 11, and the elastic protrusion 332 is capable of abutting against the bottom wall of the limiting groove 410, so as to prevent damage caused by hard collision between the base plate 330 and the limiting groove 410, and prolong the service life of the power supply mechanism. In addition, there is a friction between the elastic protrusion 332 and the bottom wall of the limiting groove 410, which prevents the base plate 330 from moving freely along the radial direction of the moving through hole 411 and affecting the plugging effect between the power clip 320 and the busbar, thereby improving the stability and reliability of power supply.

Specifically, referring to FIG. 3, the elastic protrusion 332 is an elastic plate protruding from the base plate 330. At least two elastic plates are provided and spaced apart on a side of the base plate 330 away from the computer case 11.

Referring to FIG. 2 to FIG. 4, in an embodiment, the power supply mechanism for the server further includes a sealing member 500 provided in the first through hole 210 and configured to allow the cable 100 to extend through.

The sealing member 500 can fill a gap between the cable 100 and the first through hole 210, and prevent the coolant in the accommodating cavity 12 from entering the waterproof cavity 230 from the gap between the first through hole 210 and the cable 100, and then entering the connection between the second wiring portion 120 and the power supply plug 300 or flowing out of the computer case 11, so as to ensure the waterproof housing effect of the waterproof housing 200.

As an example, the sealing member 500 in the above embodiment may be an elastic sealing ring provided on a hole wall of the first through hole 210, or may be a sealing joint provided on a side of the first through hole 210, which is not specifically limited herein.

Referring to FIG. 2 to FIG. 5, in an embodiment, the sealing member 500 includes a cable gland 510 provided in the waterproof housing 200 and provided with a mounting through hole 511, and the mounting through hole 511 is in communication with the first through hole 210.

The mounting through hole 511 of the cable gland 510 can allow the cable 100 to extend therethrough, and the cable gland 510 can ensure that there is no gap between the cable 100 and the mounting through hole 511, so as to prevent the coolant in the accommodating cavity 12 from entering the waterproof cavity 230. In addition, the cable gland 510 can lock the cable 100 to prevent the cable 100 from axial displacement or rotation in the mounting through hole 511, thereby ensuring the reliability of the connection between the second wiring portion 120 of the cable 100 and the power supply plug 300.

Figure 5:
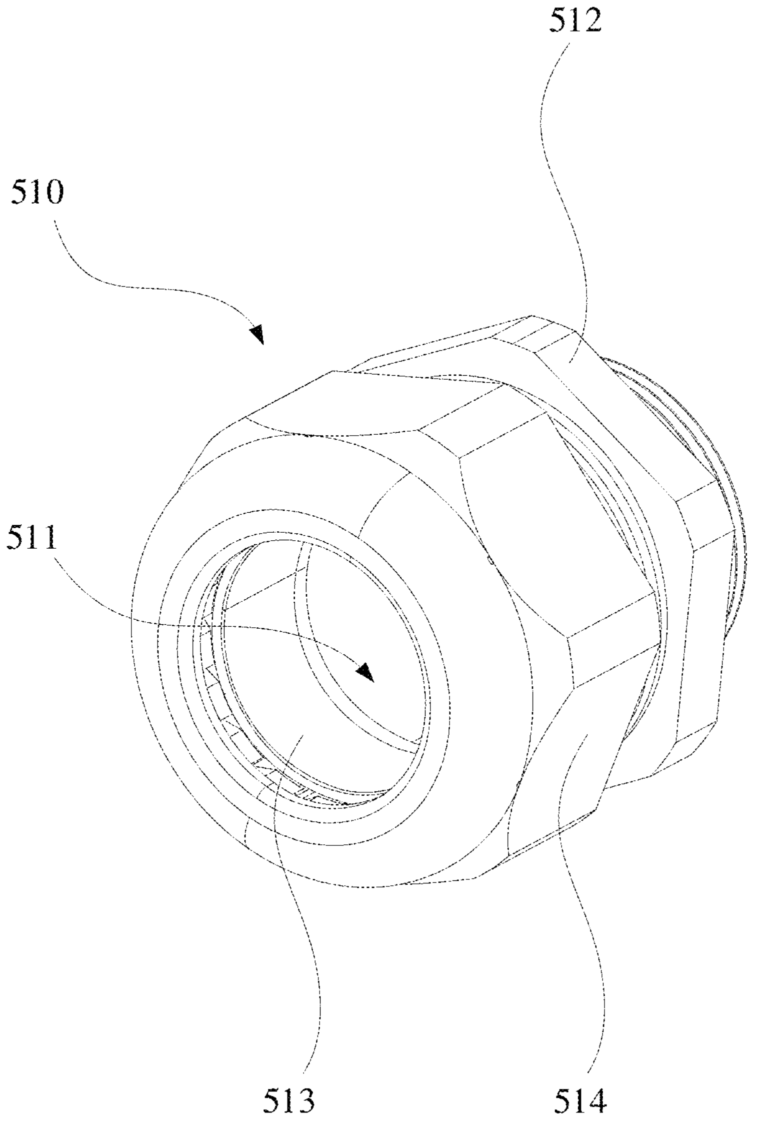
FIG. 5 is a perspective view of a cable gland according to an embodiment.

Specifically, referring to FIG. 5, the cable gland 510 includes a sealing base 512, a sealing ring 513, and a fastening knob 514. The mounting through hole 511 is formed on the sealing base 512, and the sealing ring 513 is provided in the mounting through hole 511. The fastening knob 514 is rotatably screwed to an outer wall of the sealing base 512. When the fastening knob 514 is rotated, the outer wall of the sealing base 512 can be pressed and deformed, and then the sealing ring 513 in the mounting through hole 511 is pressed, so that the sealing ring 513 can be tightly attached to the outer wall of the cable 100, so as to prevent the coolant in the accommodating cavity 12 from entering the waterproof cavity 230 through the mounting through hole 511, and prevent the cable 100 from axial displacement or rotation in the mounting through hole 511, thereby ensuring the reliability of the connection between the second wiring portion 120 of the cable 100 and the power supply plug 300.

Further, the fastening knob 514 can be removed from the sealing base 512 to facilitate the removal of the cable 100, and the removal process is simple.

The above-mentioned embodiments do not constitute a limitation on the protection scope of the technical solution. Any modifications, equivalent replacements and improvements made within the spirit and principles of the above-mentioned embodiments shall be included within the protection scope of this technical solution.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall all fall within the protection scope of the present disclosure.

What is claimed is:

1. A power supply mechanism for a server, the server comprising a computer case, the computer case being provided with an accommodating cavity and a power supply through hole that are in communication with each other, the power supply mechanism comprising:

a cable comprising a first wiring portion and a second wiring portion at both ends thereof, and the first wiring portion is configured to be electrically connected to an electric element in the accommodating cavity;

a waterproof housing provided in the accommodating cavity, wherein the waterproof housing is provided with a waterproof cavity, a first through hole, and a second through hole that are in communication with each other, the second wiring portion extends through the first through hole and is located in the waterproof cavity, and the second through hole is in communication with the power supply through hole; and a power supply plug extending through the power supply through hole and the second through hole and electrically connected to the second wiring portion;

wherein a side of the waterproof housing away from the accommodating cavity is provided with a flange, and the flange is configured to abut against a hole wall of the power supply through hole;

wherein the flange extends circumferentially around the second through hole to form a moving channel, the power supply plug comprises a moving portion electrically connected to the second wiring portion, and the moving portion extends through the moving channel and is capable of moving in a radial direction of the moving channel;

wherein the power supply plug further comprises a power clip and a base plate, one side of the base plate is connected to the power clip, another side of the base plate is connected to the moving portion, and the base plate is located outside the computer case and is configured to abut against an outer wall of the computer case.

2. The power supply mechanism according to claim 1, wherein the waterproof housing comprises a housing cover and a housing body, the housing cover is connected to the housing body to form the waterproof cavity, the first through hole is provided on the housing cover, and the second through hole is provided on the housing body.

3. The power supply mechanism according to claim 1, further comprising a limiting cover provided outside the computer case, wherein the limiting cover is provided with a limiting groove arranged toward the power supply through hole, a bottom wall of the limiting groove is provided with a moving through hole and is capable of abutting against the base plate, and the power clip extends through the moving through hole and is capable of move in a radial direction of the moving through hole.

4. The power supply mechanism according to claim 3, wherein the base plate is provided with a limiting protrusion on a side thereof away from the computer case, the bottom wall of the limiting groove is further provided with a strip-shaped through hole, and the limiting protrusion extends through the strip-shaped through hole.

5. The power supply mechanism according to claim 3, wherein the base plate is provided with an elastic protrusion on the side thereof away from the computer case, and the elastic protrusion is capable of abutting against the bottom wall of the limiting groove.

6. The power supply mechanism according to claim 1, further comprising a sealing member provided in the first through hole and configured to allow the cable to extend through.

7. The power supply mechanism according to claim 6, wherein the sealing member comprises a cable gland provided in the waterproof housing, and the cable gland is provided with a mounting through hole in communication with the first through hole.

8. A server comprising:

a computer case provided with an accommodating cavity and a power supply through hole that are in communication with each other;

an electrical element provided in the accommodating cavity; and the power supply mechanism according to claim 1.

* * * * *